United States Patent
Koduri

(10) Patent No.: US 8,810,023 B2
(45) Date of Patent: Aug. 19, 2014

(54) CANTILEVER PACKAGES FOR SENSOR MEMS (MICRO-ELECTRO-MECHANICAL SYSTEM)

(75) Inventor: Sreenivasan Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 13/542,827

(22) Filed: Jul. 6, 2012

(65) Prior Publication Data

US 2014/0008737 A1    Jan. 9, 2014

(51) Int. Cl.
*H01L 29/84* (2006.01)

(52) U.S. Cl.
USPC ............................................. 257/692; 438/118

(58) Field of Classification Search
USPC ............... 257/684, 692, 737, 738, E21.7; 438/109, 118
See application file for complete search history.

(56) References Cited

U.S. PATENT DOCUMENTS

| | | | |
|---|---|---|---|
| 5,708,293 A | 1/1998 | Ochi et al. | |
| 6,072,230 A | 6/2000 | Carter, Jr. et al. | |
| 6,828,663 B2 | 12/2004 | Chen et al. | |
| 2003/0067057 A1* | 4/2003 | Wu | 257/666 |
| 2004/0021402 A1 | 2/2004 | Morley et al. | |
| 2007/0272993 A1* | 11/2007 | Haag et al. | 257/434 |
| 2012/0153446 A1 | 6/2012 | Jiang | |

* cited by examiner

*Primary Examiner* — Thomas L Dickey
(74) *Attorney, Agent, or Firm* — Steven A. Shaw; Frederick J. Telecky, Jr.

(57) ABSTRACT

A packaged sensor MEMS (100) has a semiconductor chip (101) with a protected cavity (102) including a sensor (105), the cavity surrounded by solder bumps (130) attached to the chip terminals; further a leadframe with elongated and radially positioned leads (131), the central lead ends (131*a*) attached to the bumps. Insulating material (120) encapsulates chip and central lead ends, leaving the chip surface (101*a*) opposite the cavity and the peripheral lead ends (131*b*) un-encapsulated. The un-encapsulated peripheral lead ends are bent into cantilevers for attachment to a horizontal substrate (160), the cantilevers having a geometry to accommodate, under a force lying in the plane of the substrate, elastic bending and stretching beyond the limit of simple elongation based upon inherent material characteristics, especially when supported by lead portions with curved, toroidal, or multiple-bendings geometries.

14 Claims, 4 Drawing Sheets

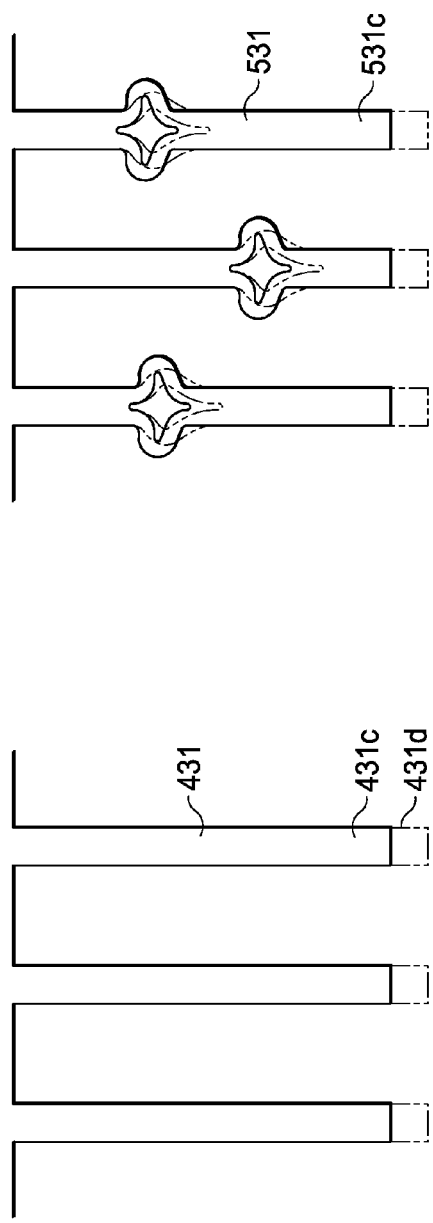
FIG. 5
FIG. 4
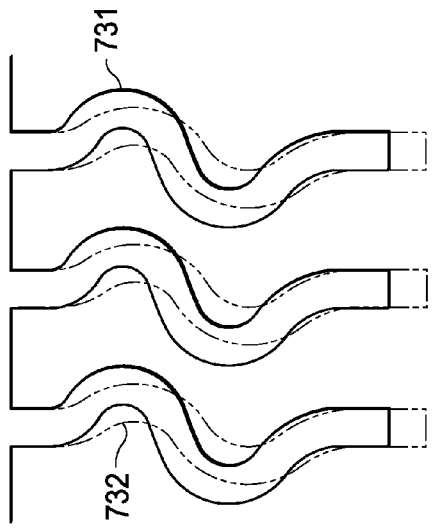
FIG. 7
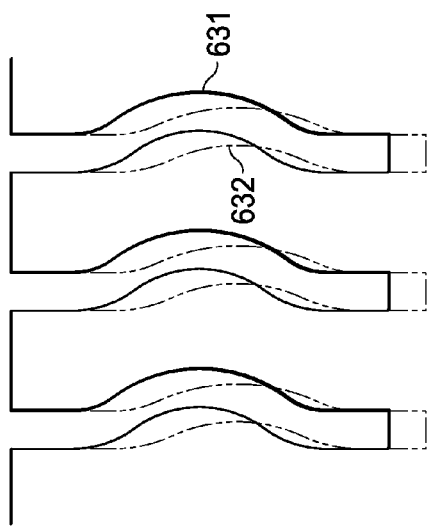
FIG. 6

CANTILEVER PACKAGES FOR SENSOR MEMS (MICRO-ELECTRO-MECHANICAL SYSTEM)

FIELD OF THE INVENTION

The present invention is related in general to the field of semiconductor devices and processes, and more specifically to the structure and fabrication method of micro-electro-mechanical devices (MEMS), especially for sensors, in gull-wing packages suitable for industrial applications.

DESCRIPTION OF RELATED ART

The wide variety of products collectively called Micro-Electro-Mechanical devices (MEMS) are small, low weight devices on the micrometer to millimeter scale, which may have mechanically moving parts and often movable electrical power supplies and controls, or they may have parts sensitive to thermal, acoustic, or optical energy. MEMS have been developed to sense mechanical, thermal, chemical, radiant, magnetic, and biological quantities and inputs, and produce signals as outputs. Because of the moving and sensitive parts, MEMS have a need for physical and atmospheric protection. Consequently, MEMS are placed on or in a substrate and have to be surrounded by a housing or package, which has to shield the MEMS against ambient and electrical disturbances, and against stress.

A Micro-Electro-Mechanical System (MEMS) integrates mechanical elements, sensors, actuators, and electronics on a common substrate. The manufacturing approach of a MEMS aims at using batch fabrication techniques similar to those used for microelectronics devices. MEMS can thus benefit from mass production and minimized material consumption to lower the manufacturing cost, while trying to exploit the well-controlled integrated circuit technology.

An example of MEMS includes mechanical sensors, both pressure sensors including microphone membranes, and inertial sensors such as accelerometers coupled with the integrated electronic circuit of the chip. The mechanically moving parts of a MEMS are fabricated together with the sensors and actuators in the process flow of the electronic integrated circuit (IC) on a semiconductor chip. The mechanically moving parts may be produced by an undercutting etch at some step during the IC fabrication; examples of specific bulk micromachining processes employed in MEMS sensor production to create the movable elements and the cavities for their movements are anisotropic wet etching and deep reactive ion etching.

Another example is an 8-pin digital infrared (IR) temperature sensor made in a silicon chip of about 2 by 2 mm side length, which includes a thermopile (multiple thermo-elements) of bismuth/antimony or constantan/copper pairs on a sensor membrane suspended in a cavity created by anisotropic silicon wet etching through a grid of holes (hole diameter about 18 µm, hole pitch about 36 µm center-to-center) in the membrane. The cavity is closed by a laminate cover-plate (about 14 µm thick) overlaying the membrane to protect the sensors, and the IR radiation reaches the thermocouple tips through the rear silicon bulk of the cavity. The resulting hot spot on the thermocouple tips creates a temperature difference between the tips and the opposite thermocouple ends at ambient temperature, which in turn creates the voltage difference to be monitored as a contactless temperature measurement. For the 8 pins, the chip may have 8 solder bumps surrounding the cover plate-protected cavity or 8 pressure contacts and is thus commonly referred to as a wafer-chip-scale package (WCSP); in the modification with pressure (or solderable) contacts, the package belongs to the Quad Flat No-Lead (QFN) family.

SUMMARY OF THE INVENTION

Applicant realized that a wide field of industrial, automotive and consumer applications would open up if a MEMS device such as a sensor could safely and cost-effectively be encapsulated in a housing suitable not only to allow unobstructed access of the physical entity-to-be-monitored to the MEMS, but also to absorb thermo-mechanical stress and environmental vibrations so prevalent in these applications. The enveloping and stress-absorbing package has to leave a controlled window for light, sound, gas, moisture, etc. to transmit through. In the example of a temperature sensor, the IR radiation would need for the wavelengths-to-be-monitored unobstructed access to the IR sensor located in a cavity.

In a sensor MEMS, the semiconductor chip has a surface with a protected cavity containing the sensor and a plurality of solder bumps of the chip terminals surrounding the cavity. When an industrial application of a MEMS assembled on a board involves wide and abrupt temperature swings, significant thermo-mechanical stresses are caused due to widely different coefficients of thermal expansion between the silicon-based sensor and the material of the board. These stresses are sufficient to induce microcracks in the attached solder bumps, leading to fracture failures.

Applicant solved the problem of protecting the MEMS against stress-induced failures, when he discovered that a MEMS package with elastic cantilever leads acts as a stress-absorbing compliant barrier between the silicon-based MEMS and the external environment.

Suitable packages have cantilever leads protruding from the package, which can accommodate, under a force lying in the plane of the expanding and contracting substrate, elastic bending and stretching beyond the limit of simple elongation based upon inherent lead material characteristics. Such elastic cantilever properties can be achieved by cantilever geometries, which may be selected from straight geometry, curved geometry, toroidal geometry, and multiple-bendings geometry.

Applicant found that the needs for unobstructed access to the MEMS sensor and the elastic cantilever leads of the package can be simultaneously satisfied when the central lead portions of the leadframe match the chip solder bumps so that the bumps can be attached to the central lead ends and then encapsulated, while the chip surface opposite the cavity with the sensor remains un-encapsulated. The peripheral lead portions also remain un-encapsulated when insulating material encapsulates the MEMS chip and the central lead ends; since these lead portions protrude as cantilevers from the package, they may be formed so that the cantilevers operate as springs to absorb thermo-mechanical stresses.

Another embodiment of the invention implements the bump-studded MEMS chip into a pre-fabricated plastic housing with the leadframe integrated into the housing. The housing is made of an insulating material shaped in small-outline configuration and preferably has a central recess of a depth greater than the chip height with bumps. The leadframe has elongated and radially positioned leads with the central lead ends matching the chip solder bumps and positioned on the bottom of the recess, and the peripheral lead ends protruding from the housing. In a solder reflow step, the chip solder bumps are attached to the leadframe so that the recess depth is equal to or surpasses the bumped chip height. When the protruding lead ends are bent into cantilevers for attachment to a horizontal substrate, the cantilevers having a geometry to accommodate, under a force lying in the plane of the substrate, elastic bending and stretching beyond the limit of simple elongation based upon inherent material characteristics.

BRIEF DESCRIPTION OF THE DRAWINGS

FIGS. 4 to 7 illustrate examples of geometries for the peripheral lead ends protruding from the package, which contribute to the leads elastic bending and stretching properties beyond the limit of simple elongation based upon inherent lead material characteristics.

FIG. 4 depicts straight lead geometry for simple elongation.

FIG. 5 shows toroidal lead geometry for elastic stretching and bending.

FIG. 6 illustrates curved lead geometry for elastic stretching and bending.

FIG. 7 depicts multiple-bending lead geometry for elastic stretching and binding.

DETAILED DESCRIPTION OF THE PREFERRED EMBODIMENTS

Figure 1:
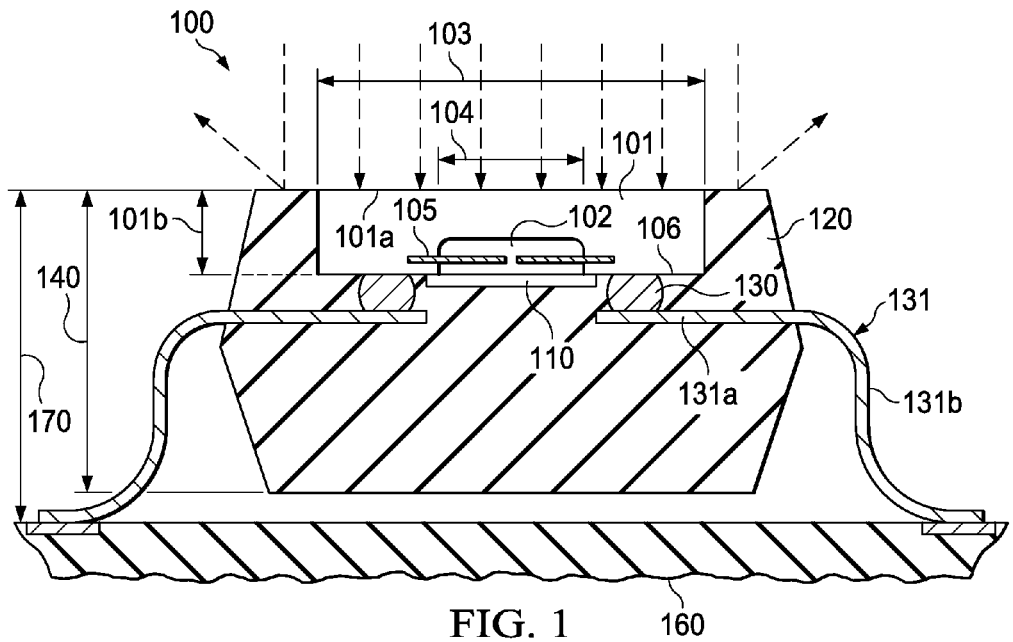
FIG. 1 shows a cross section of an exemplary radiation-sensing MEMS assembled in a package with stress-absorbing cantilever leads according to the invention.

FIG. 1 illustrates an exemplary embodiment of the invention, a device generally designated 100. The device includes a semiconductor chip 101 with terminals 106; chip 101 is embedded in an insulating package 120. Chip 101 contains a cavity 102 with a micro-electro-mechanical system (MEMS) 105. An exemplary chip suitable as an infrared-sensing MEMS may be square-shaped with a side length 103 of about 2 mm. The terminals of chip 101 are attached by solder bumps 130 to package leads 131, which are formed as cantilever leads. The plurality of cantilever leads 131 of package 120 are interconnected, preferably by solder, to external parts such as substrate 160. While thickness 101b of chip 101 may be in the range between 0.2 and 0.3 mm, the height 140 of package 120 may be any standard thickness of SOIC devices; as an example, the height 170 of package 120 together with bent leads 131 may be approximately 1 mm. Package 120 is preferably made of an insulating plastic or ceramic compound; the package encapsulates chip 101 and the central lead ends 131a, leaving the chip surface 101a opposite the cavity 102 and the peripheral lead ends 131b un-encapsulated.

The material of substrate 160, while generally insulating, depends on the application of device 100; as an example of the application, infrared-sending MEMS are used in ever increasing numbers for industrial purposes such as automotive and household applications. These applications are characterized by wide and often rapid temperature swings, for instance from sub-zero temperatures to more temperatures well above 100° C. In order to keep the cost of sensor MEMS low, preferred substrate selections for industrial applications include plastic and ceramic materials. Given the wide temperature variations in industrial applications, the selection of plastic and ceramic materials for substrate 160 represents a challenge for the reliability of the sensor MEMS devices 100 due to the thermo-mechanical stress caused by the much higher coefficient of thermal expansion (CTE) of the substrate materials compared to the CTE of the silicon chip 101 of the MEMS (typically about one order of magnitude or more). The methodology to construct the cantilever leads 131 as stress-absorbing compliant barriers between the silicon-based MEMS and the substrate 160 is discussed below.

Chip 101 has the opening 104 of cavity 102 facing away from the surface 101a of chip 101 and the top side of device 100. In the exemplary embodiment of FIG. 1, located inside cavity 102 is MEMS 105, preferably a radiation sensor. Exemplary sensors may be selected from a group responsive to electro-magnetic radiation, such as visible or infrared light. A preferred example as sensor in FIG. 1 is a digital infrared (IR) temperature sensor including a thermopile (multiple thermo-elements) of bismuth/antimony or constantan/copper pairs on a sensor membrane 105. The membrane is suspended in cavity 102 created by anisotropic silicon wet etching through a grid of holes (hole diameter about 18 μm, hole pitch about 36 μm center-to-center) in the membrane.

Figure 2A:
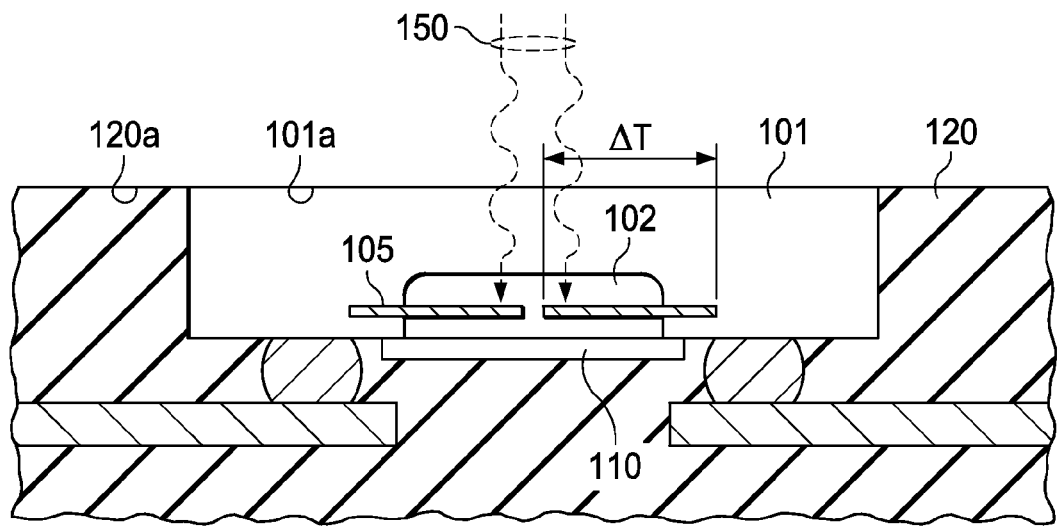
FIG. 2A shows an enlarged cross section a portion of the MEMS sensor of FIG. 1, wherein the infrared radiation sensor (thermopile) is in a protected cavity; the MEMS has solder bumps surrounding the cavity for attachment to the central lead ends of the leadframe.
Figure 2B:
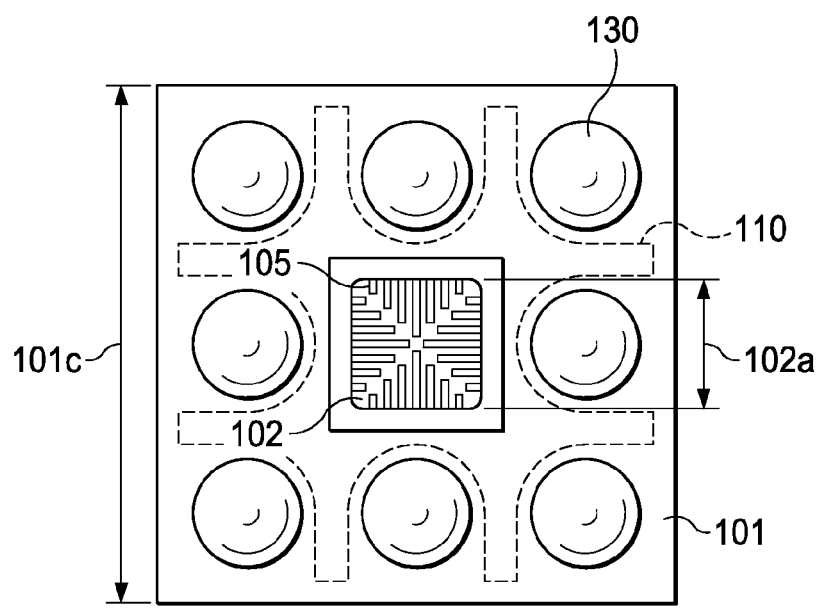
FIG. 2B is a bottom view of the MEMS, before the MEMS solder balls are attached to the central lead ends.

For clarity purposes, the MEMS of device 100 is magnified in the cross section of FIG. 2A (together with portion of the encapsulating package) and in the bottom view of FIG. 2B (without the package). As FIG. 2A shows, the surface 101a of MEMS chip 101 is coplanar with surface 120a of package 120. Opposite surface 101a, the opening of cavity 102 of the MEMS chip is closed by a laminate cover-plate 110 (about 15 μm thick) overlaying the membrane 105 to protect the sensors. The plate, for instance made of cured photoresist, is transmissive to the radiation sensed by the MEMS. It should be pointed out that cover plate 110 not only needs to seal cavity 102, but also needs to provide thermal isolation of the MEMS relative to encapsulation compound 120. Such thermal isolation prevents the temperature sensor 105 from being thermally shortened to encapsulation compound 120. As a consequence, a thermally shielding additional layer may have to be added to plate 110; alternatively, a pocket of reduced atmospheric pressure, such an additional cavity, may have to be added to layer 120.

In the example of FIG. 2A, the IR radiation 150 reaches the center area of the thermocouples, which have been formed from the membrane 105. On the way, radiation 150 traverses the bulk of semiconductor chip 101, which may act as a filter. Due to the incoming radiation 150, a hot spot on the thermocouple tips creates a temperature difference between the tips and the opposite thermocouple ends, which retain ambient temperature. The resulting temperature difference is marked in FIG. 2A by delta T. The temperature difference in the thermocouples creates the voltage difference to be monitored as a contactless temperature measurement.

FIG. 2B illustrates a bottom view of exemplary chip 101, before the chip is assembled in the package. Exemplary chip 101 is square-shaped with side length 101c of about 2 mm and has a window to cavity 102 with a side length 102a of about 0.4 mm. Solder balls 130 are attached to the plurality of terminals of MEMS chip 101 (the terminals being preferably copper pads). In conventional usage, solder balls 130 would be directly attached to a substrate. Consequently, thermo-mechanical stresses due to the mismatch of CTEs of substrate and semiconductor chip have to be absorbed directly by the attached solder balls. Experience has shown that the solder balls have a high probability of fatiguing, in some applications after only relatively few temperature cycles and then developing solder microcracks.

Figure 3:
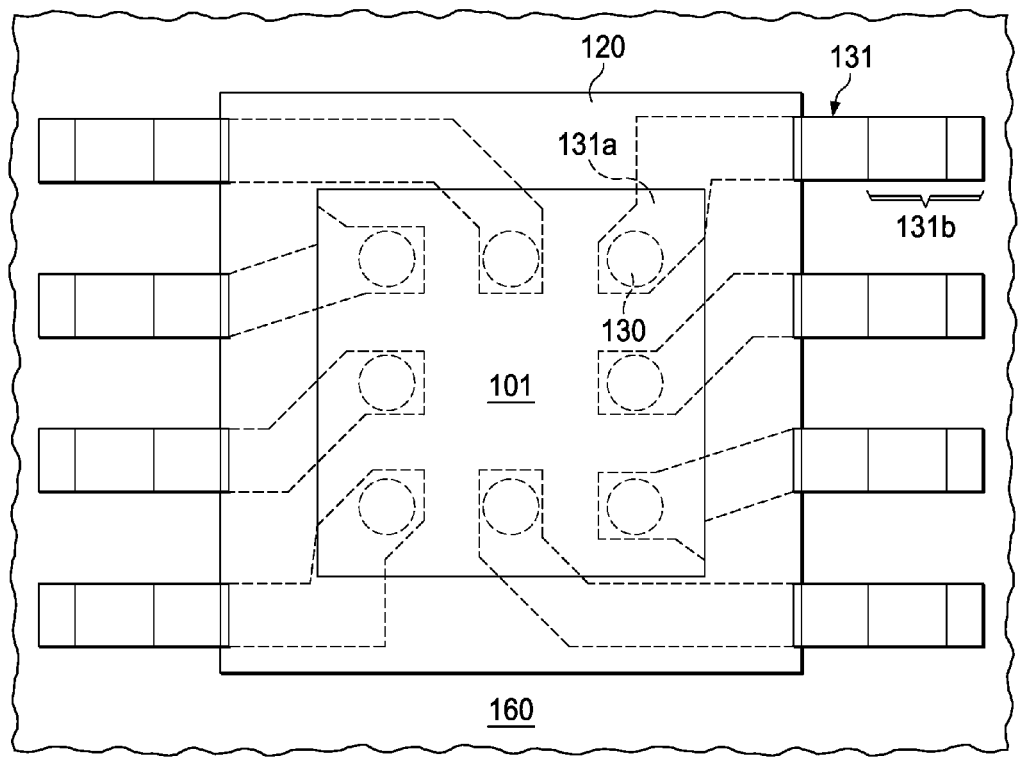
FIG. 3 depicts a top view of an exemplary device with a SOIC-type leadframe suitable for attaching the solder balls of the sensor MEMS; the encapsulation of the device is assumed transparent.

According to the invention, a leadframe with elongated leads 131 is provided. The leadframe is stamped or etched from a base sheet metal selected from, but not limited to, copper, copper alloy, aluminum, iron-nickel alloy, or Kovar™; preferred thicknesses of the base material are from about 0.15 to 0.25 mm. The central leadframe portions have a metallurgical surface suitable for adhesion to plastic or ceramic compounds used as material for package 120, especially to molding compounds. The peripheral leadframe portions protrude from the package and have a metallurgical surface suitable for attachment to external parts 160, preferably using a solder technology. As FIG. 3 shows, the central lead ends 131a are flat and matching the solder balls 130 of chip 101 so that they can be attached to the solder balls; in a general sense, the central leads may be considered radially positioned. The outer lead ends 131b include the elongated cantilever portion of leads 131 whereby the outer ends 131b can be formed in three-dimensional fashion for instance as gull-wings (see FIG. 1) or as J-leads.

As mentioned, when an industrial application of a MEMS assembled on a board involves wide and abrupt temperature swings, significant thermo-mechanical stresses are caused due to widely different coefficients of thermal expansion between the silicon-based sensor and the material of the board. The MEMS can be protected against stress-induced failures, when the MEMS package has elastic cantilever leads acting as stress-absorbing compliant barriers between the silicon-based MEMS and the external environment.

Suitable packages, such as depicted in the exemplary device of FIG. 1, have cantilever leads protruding from the package, which can accommodate, under a force lying in the plane of the expanding and contracting substrate, elastic bending and stretching beyond the limit of simple elongation based upon inherent lead material characteristics. Such elastic cantilever properties can be achieved by cantilever geometries, which may be selected from leads with straight geometry, curved geometry, toroidal geometry, and multiple-bendings geometry.

For a lead protruding from the package in straight lead geometry, as depicted by lead 431 of FIG. 4, the process step of forming the lead uses a force, which has a vertical component causing the bending, and a horizontal component causing the elongation. The outside force, applied along the length of the lead 431, stretches the lead in the direction of the length, while the dimension of the width is only slightly reduced, so that the new shape appears slightly elongated. For elongations small (i.e. less than 8%) compared to the length, and up to a limit, called the elastic limit given by the material characteristics, the amount of elongation is linearly proportional to the force. Beyond that elastic limit, the segment would suffer irreversible changes and damage to its inner strength and may eventually break. The resulting un-encapsulated peripheral lead ends are bent into cantilevers suitable for attachment to a horizontal substrate, as depicted in exemplary FIG. 1. As shown in FIGS. 4 to 7, the cantilevers have a geometry to accommodate, under a force lying in the plane of the substrate, elastic bending and stretching beyond the limit of simple elongation based upon inherent material characteristics. When attached to a horizontal substrate, the package leads are suitable to act as spring-like compliant cantilevers.

FIG. 4 indicates the elongation-only approach. Tip 431c of lead 431 is attached to a substrate. The solid line represents the lead configuration at ambient temperature. At elevated temperatures, the substrate expands due to its high CTE and exerts force aiming at elongating lead 431 by a small fraction designated 431d.

The two-fold approach substituting for an elongation-only solution (FIG. 4) includes linearizing a design in bending, and stretching through pulling (FIGS. 5, 6, and 7). The contribution of linearizing can be obtained when a topologically long body is first designed so that it contains curves, bendings, meanderings or similar non-linearities. By applying force, at least part of the non-linearities is stretched or straightened so that afterwards the body is elongated. This can be visualized in the familiar action that an arm, angled at the elbow, will be lengthened when the lower arm is stretched to get in line with the upper arm.

The contribution of stretching is similar to the elongation in the direction of the lead length discussed above. This stretching, therefore, will remain safely below the elastic limit of the leadframe material. The nature and effect of both contributions will become more readily understood from the following description of the illustrations FIGS. 5, 6, and 7. In all examples, the tips of the leads are attached to a substrate with high CTE. At elevated temperatures, the expanding substrate exerts force aiming at pulling at the lead. In FIG. 5, toroids are shown by straight lines in their original stamped, or etched, design before the pulling process, and by dashed lines in their final shape after the pulling process. The contribution for achieving the additional length of the leads from straightening the designed-in curved shape of the toroids is evident.

In FIGS. 6 and 7, the leads together with their bendings are shown by solid lines in their original (stamped or etched) design before the extension process, designated 631 and 731 respectively, and by dashed lines in their shapes after the extension process, designated 632 and 732 respectively. The significant contribution from the partial straightening the designed-in curved shape of the lead bendings is clearly visible for achieving the additional length of the lead.

With this designed-in capability of bending and stretching selected leadframe leads beyond the limit of simple elongation based upon inherent material characteristics, leadframes with spring-like leads can be manufactured for attachment to boards in industrial MEMS applications with elastic features for large and rapid temperature swings which cannot be achieved by solder bump attachments to boards.

Another embodiment of the invention is a method for fabricating a sensor MEMS, which starts with the step of providing a semiconductor chip, which has a surface with a protected cavity containing a sensor. The cavity is surrounded by solder bumps attached to the chip terminals.

Furthermore, a leadframe is provided, which has elongated and radially positioned leads; the central lead ends are solderable and match the chip solder bumps. In addition, the leads may have geometries selected from a group including straight geometry, curved geometry, toroidal geometry, and multiple bendings geometry.

In the next process step, the chip solder bumps are aligned to the central lead ends. The solder bumps are then reflowed, whereby the chip is attached to the leadframe. Thereafter, the chip and the central lead ends are encapsulated in an insulating material, leaving un-encapsulated the chip surface opposite the cavity and the peripheral lead ends. When the leads include portions with curved geometries, toroidal geometries, or multiple bendings geometries, those lead portions also remain un-encapsulated. A preferred encapsulation method is a molding process using a polymeric compound.

In the last process step, the un-encapsulated lead ends are bent into spring-like cantilevers. When these cantilever leads are attached to external parts like substrates and boards, preferably by soldering, they are able to accommodate, under a force lying in the plane of the substrate, elastic bending and stretching beyond the limit of simple elongation based upon inherent material characteristics.

Figure 8:
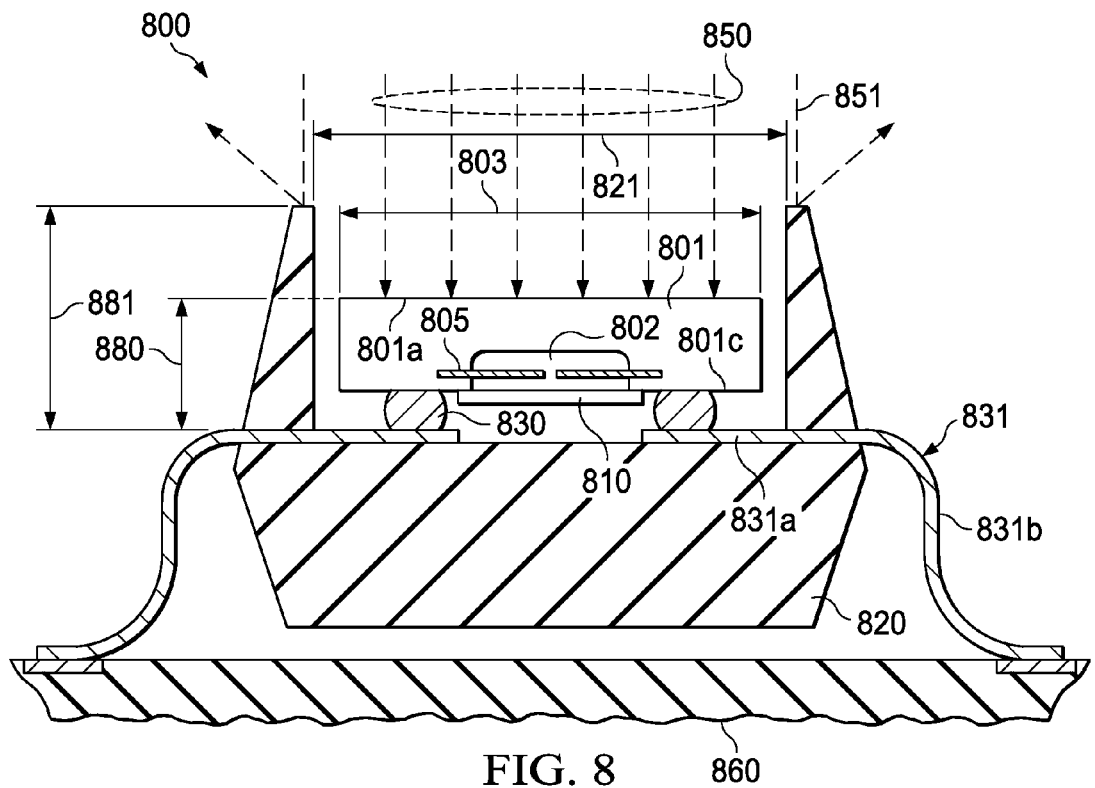
FIG. 8 shows a cross section of an exemplary radiation-sensing MEMS assembled in a package with stress-absorbing cantilever leads, wherein the package has a recess of a depth greater than the assembled chip height.

Another embodiment of the invention is a packaged sensor MEMS as illustrated in the exemplary FIG. 8. The device, generally designated 800, includes a semiconductor chip 801, which has a lateral dimension 803 and a surface 801c with a cavity 802, protected by a cover plate 810. Cavity 802 contains a sensor 805. The cavity is surrounded by solder bumps 830, which are attached to the chip terminals. In FIG. 8, the height of the bumped chip is designated 880.

In contrast to the embodiment illustrated in FIGS. 1 and 2, the very structure of the embodiment in FIG. 8 offers, with regard to cover plate 810, thermal isolation of plate 810 from encapsulation material 820. Consequently, no additional precaution for thermal isolation of plate 810 from material 820 is needed.

Device 800 further includes a package consisting of a housing 820 and a leadframe integrated in the housing. Housing 820 is made of an insulating material such as plastic or ceramic, preferably shaped in small-outline configuration Housing 820 has lateral dimension 821 greater than chip dimension 803, and has a central recess of a depth 881 greater than the chip height 880. The leadframe has elongated and radially positioned leads 831 with the central lead ends solderable, matching the chip solder bumps 830 and positioned on the bottom of the recess; the peripheral lead ends 831b are protruding from the housing 820.

The chip solder bumps 830 are attached to the leadframe so that the recess depth 831 surpasses the bumped chip height 830. When the sidewalls of the recess surpass the surface 101a of chip 101, it has the technical advantage of constricting the amount of thermal radiation 850, which can impinge on chip 101; excess radiation 851 is reflected away. Temperature measurements can thus be more localized and precise.

The protruding lead ends 831b are bent into cantilevers for attachment to a horizontal substrate 860; the cantilevers have a geometry to accommodate, under a force lying in the plane of the substrate, elastic bending and stretching beyond the limit of simple elongation based upon inherent material characteristics. As a consequence, the cantilevers act as springs able to absorb thermo-mechanical stress originating from the CTE difference between device 800 and substrate 860 and thus to act as a compliant barrier between the silicon-based MEMS and the external environment.

Figure 9:
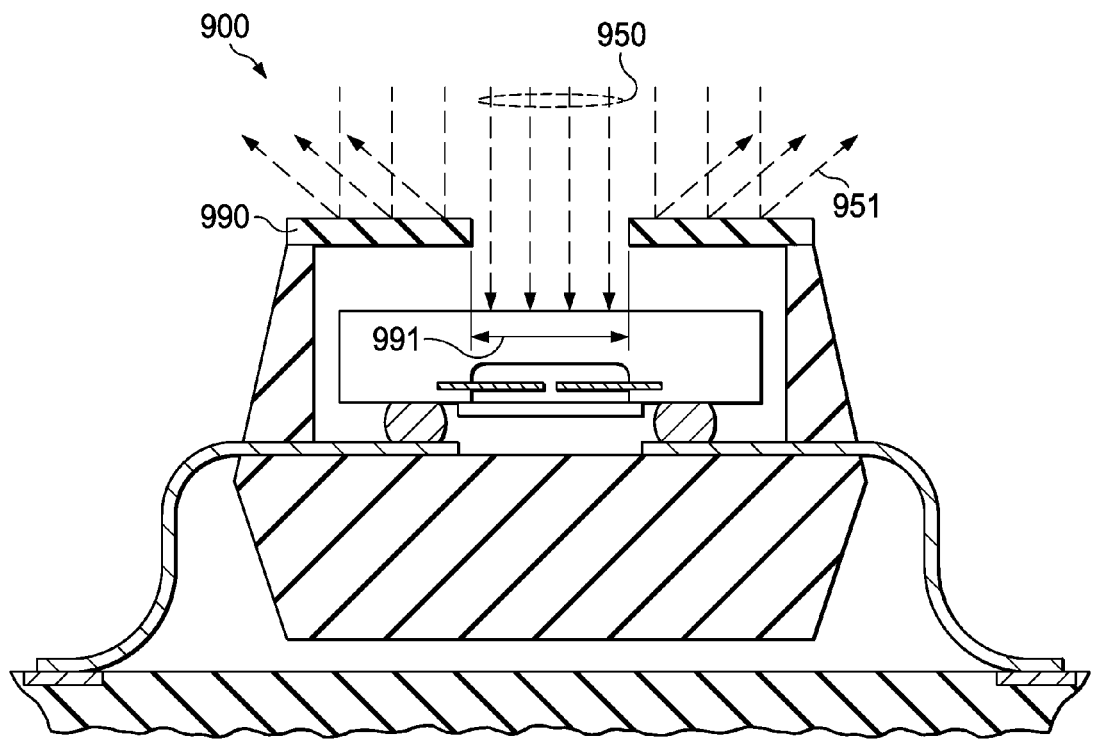
FIG. 9 illustrates a cross section of the exemplary radiation-sensing MEMS of FIG. 8 with an iris attached to the sidewalls of the package recess.

Even more localized and precise temperature measurements can be achieved by an embodiment displayed in FIG. 9 and generally designated 900. Device 900 has an iris 990 with opening 991 attached to the sidewalls of the recess in the package. Opening 991 narrows the incoming radiation to the constricted beam 950, while the balance 951 of the incoming radiation is reflected away by iris 990.

Another embodiment of the invention is a method for fabricating a MEMS with recessed sensor. The process starts with the step of providing a semiconductor chip, which has a surface with a protected cavity containing a sensor. The cavity is surrounded by solder bumps attached to the chip terminals. After attachment, the bumped chip has a height.

Furthermore, a package is provided, which includes a housing and a leadframe integrated in the housing. The housing is made of an insulating material such as plastic or ceramic, and has preferably a small outline configuration. The housing further has a central recess of a depth greater than the height of the bumped chip.

The leadframe has elongated and radially positioned leads; the central lead ends are solderable and match the chip solder bumps. The central lead ends are positioned on the bottom of the recess, and the peripheral lead ends protrude from the housing. The peripheral leads have a geometry selected from a group including straight geometry, curved geometry, toroidal geometry, and multiple bendings geometry.

In the next process step, the chip solder bumps are aligned to the central lead ends. The solder bumps are then reflowed, whereby the chip is attached to the leadframe so that the recess depth surpasses the height of the bumped chip.

In the final process step, the peripheral leads, which protrude from the housing, are formed by bending into spring-like cantilevers. For some MEMS devices, the final process step is preceded by a process step, in which an iris is attached over the package recess in order to narrow the incoming radiation beam impinging on the sensor MEMS.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to MEMS having parts moving mechanically under the influence of an energy flow (acoustic, thermal, or optical), a temperature or voltage difference, or an external force or torque. Certain MEMS with a membrane, plate or beam can be used as a pressure sensor (for instance microphone and speaker), inertial sensor (for instance accelerometer), or capacitive sensor (for instance strain gauge and RF switch); other MEMS operate as movement sensors for displacement or tilt; bimetal membranes work as temperature sensors.

It is therefore intended that the appended claims encompass any such modifications or embodiment.

I claim:

1. A packaged sensor micro-electro-mechanical system (MEMS) comprising:
    a semiconductor chip having a surface with a protected cavity including a sensor, the cavity surrounded by solder bumps attached to the chip terminals;
    a leadframe having elongated leads, the central lead ends matching the chip solder bumps and being attached to the bumps;
    insulating material encapsulating chip and central lead ends, leaving the chip surface opposite the cavity and the peripheral lead ends un-encapsulated; and
    the un-encapsulated peripheral lead ends bent into spring-like cantilevers for attachment to a horizontal substrate, the spring-like cantilevers having a geometry to accommodate, under a force lying in the plane of the substrate, elastic bending and stretching beyond the limit of simple elongation based upon inherent material characteristics.

2. The MEMS of claim 1 wherein the leadframe is selected from a group including copper, aluminum, alloys thereof, iron-nickel alloys, and Kovar™.

3. The MEMS of claim 2 wherein the un-encapsulated peripheral lead ends have a geometry selected from a group including straight geometry, curved geometry, toroidal geometry, and multiple-bendings geometry.

4. The MEMS of claim 1 wherein the insulating material is a polymeric molding compound.

5. A packaged sensor micro-electro-mechanical system (MEMS) comprising:
   a semiconductor chip having a surface with a protected cavity containing a sensor, the cavity surrounded by solder bumps attached to the chip terminals, the bumped chip having a height;
   a package including a housing and a leadframe integrated in the housing; the housing made of an insulating material shaped in small-outline configuration and having a central recess of a depth greater than the chip height; the leadframe having elongated leads with the central lead ends solderable, matching the chip solder bumps and positioned on the bottom of the recess, and the peripheral lead ends protruding from the housing;
   the chip solder bumps attached to the leadframe so that the recess depth surpasses the bumped chip height; and
   the protruding lead ends bent into spring-like cantilevers for attachment to a horizontal substrate, the spring-like cantilevers having a geometry to accommodate, under a force lying in the plane of the substrate, elastic bending and stretching beyond the limit of simple elongation based upon inherent material characteristics.

6. The MEMS of claim 5 wherein the protruding lead ends have a geometry selected from a group including straight geometry, curved geometry, toroidal geometry, and multiple bendings geometry.

7. The MEMS of claim 5 further including an iris attached over the recess, the iris operable to narrow an incoming radiation beam.

8. A method for fabricating a micro-electro-mechanical system (MEMS) comprising the steps of:
   providing a semiconductor chip having a surface with a protected cavity containing a sensor, the cavity surrounded by solder bumps attached to the chip terminals;
   providing a leadframe having elongated leads, the central lead ends solderable and matching the chip solder bumps;
   aligning the chip solder bumps on the central lead ends and reflowing the solder bumps, thereby attaching the chip to the leadframe;
   encapsulating chip and central lead ends in an insulating material, leaving the chip surface opposite the cavity and the peripheral lead ends un-encapsulated; and
   bending the un-encapsulated lead ends into spring-like cantilevers.

9. The method of claim 8 wherein the step of encapsulating is a molding process using a polymeric compound.

10. The method of claim 8 wherein the un-encapsulated lead ends have a geometry selected from a group including straight geometry, curved geometry, toroidal geometry, and multiple bendings geometry.

11. A method for fabricating a micro-electro-mechanical system (MEMS) comprising the steps of:
   providing a semiconductor chip having a surface with a protected cavity containing a sensor, the cavity surrounded by solder bumps attached to the chip terminals, the bumped chip having a height;
   providing a package including a housing and a leadframe integrated in the housing,
   the housing made of an insulating material and having a central recess of a depth greater than the height of the bumped chip;
   the leadframe having elongated leads with the central lead ends solderable, matching the chip solder bumps and positioned on the bottom of the recess, and the peripheral lead ends protruding from the housing and having a geometry selected from a group including straight geometry, curved geometry, toroidal geometry, and multiple bendings geometry;
   aligning the chip solder bumps on the central lead ends;
   reflowing the solder bumps, thereby attaching the chip to the leadframe so that the recess depth surpasses the bumped chip height; and
   bending the protruding lead ends into spring-like cantilevers.

12. The method of claim 11 wherein the insulating material of the housing is a molding compound.

13. The method of claim 11 wherein the housing is shaped in small-outline configuration.

14. The method of claim 11 further including, after the step of reflowing, the step of attaching over the recess an iris narrowing an incoming radiation beam.

* * * * *